United States Patent
Ashidate et al.

(10) Patent No.: US 9,679,867 B2
(45) Date of Patent: Jun. 13, 2017

(54) SEMICONDUCTOR DEVICE HAVING A LOW-ADHESIVE BOND SUBSTRATE PAIR

(71) Applicant: Kabushiki Kaisha Toshiba, Minato-ku (JP)

(72) Inventors: Hiroaki Ashidate, Yokkaichi (JP); Kazumasa Tanida, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/928,144

(22) Filed: Oct. 30, 2015

(65) Prior Publication Data

US 2016/0126136 A1 May 5, 2016

(30) Foreign Application Priority Data

Nov. 4, 2014 (JP) ................. 2014-224602

(51) Int. Cl.
*H01L 23/52* (2006.01)
*H01L 25/00* (2006.01)
*H01L 23/00* (2006.01)

(52) U.S. Cl.
CPC .............. *H01L 24/80* (2013.01); *H01L 24/05* (2013.01); *H01L 24/08* (2013.01); *H01L 2224/03452* (2013.01); *H01L 2224/03462* (2013.01); *H01L 2224/03602* (2013.01); *H01L 2224/05568* (2013.01); *H01L 2224/05571* (2013.01);
(Continued)

(58) Field of Classification Search
CPC ............... H01L 23/528; H01L 23/5329; H01L 23/5283; H01L 25/0657
See application file for complete search history.

(56) References Cited

U.S. PATENT DOCUMENTS 6,962,835 B2 * 11/2005 Tong ...................... B23K 20/02
257/E21.505
6,972,490 B2 * 12/2005 Chang ............... H01L 23/49816
257/737
(Continued)

FOREIGN PATENT DOCUMENTS

CN 102867847 A 1/2013
CN 103247603 A 8/2013
(Continued)

OTHER PUBLICATIONS

Office Action issued in Taiwanese Patent Application No. 104136199 on Oct. 4, 2016, with English translation. (6 pages).
(Continued)

*Primary Examiner* — Ida M Soward
(74) *Attorney, Agent, or Firm* — Oblon, McClelland, Maier & Neustadt, L.L.P.

(57) ABSTRACT

A semiconductor device includes a low-adhesion film, a pair of substrates, and a metal electrode. The low-adhesion film has lower adhesion to metal than a semiconductor oxide film. The pair of substrates is provided with the low-adhesion film interposed therebetween. The metal electrode passes through the low-adhesion film and connects the pair of substrates, and includes, between the pair of substrates, a part thinner than parts embedded in the pair of substrates. A portion of the metal electrode embedded in one substrate is provided with a gap interposed between the portion and the low-adhesion film on the other substrate.

10 Claims, 6 Drawing Sheets

(52) U.S. Cl.
CPC ............ *H01L 2224/05576* (2013.01); *H01L 2224/05647* (2013.01); *H01L 2224/05686* (2013.01); *H01L 2224/06505* (2013.01); *H01L 2224/0807* (2013.01); *H01L 2224/08112* (2013.01); *H01L 2224/08121* (2013.01); *H01L 2224/08145* (2013.01); *H01L 2224/80013* (2013.01); *H01L 2224/80896* (2013.01); *H01L 2224/80902* (2013.01); *H01L 2224/80948* (2013.01); *H01L 2224/80986* (2013.01); *H01L 2224/9202* (2013.01); *H01L 2224/9205* (2013.01)

(56) References Cited

U.S. PATENT DOCUMENTS

| | | | |
|---|---|---|---|
| 7,618,844 B2* | 11/2009 | Sheats | H01L 21/4867 257/737 |
| 7,683,459 B2* | 3/2010 | Ma | H01L 23/481 257/621 |
| 7,795,139 B2* | 9/2010 | Han | H01L 21/76898 257/E23.067 |
| 8,343,803 B2* | 1/2013 | Chung | H01L 25/0657 257/678 |
| 8,368,222 B2 | 2/2013 | Okuyama | |
| 8,410,615 B2 | 4/2013 | Aoki et al. | |
| 8,426,720 B2* | 4/2013 | Liu | H01L 35/32 136/205 |
| 8,482,132 B2* | 7/2013 | Yang | H01L 24/03 257/777 |
| 8,742,585 B2 | 6/2014 | Okuyama | |
| 8,748,288 B2* | 6/2014 | Farooq | B32B 15/20 257/686 |
| 8,896,125 B2 | 11/2014 | Kagawa et al. | |
| 8,974,617 B2* | 3/2015 | Hu et al. | H01L 24/11 156/212 |
| 9,064,937 B2* | 6/2015 | Edelstein | H01L 21/76885 |
| 9,111,763 B2 | 8/2015 | Kagawa et al. | |
| 9,137,892 B2* | 9/2015 | Bando | H05K 1/0289 |
| 9,147,650 B2 | 9/2015 | Hagimoto et al. | |
| 9,190,275 B2 | 11/2015 | Fujii et al. | |
| 9,269,680 B2 | 2/2016 | Okuyama | |
| 9,443,802 B2 | 9/2016 | Kagawa et al. | |
| 2009/0001602 A1* | 1/2009 | Chung | H01L 24/94 257/777 |
| 2010/0038802 A1* | 2/2010 | Chen | H01L 21/8221 257/777 |
| 2011/0042814 A1 | 2/2011 | Okuyama | |
| 2011/0045262 A1* | 2/2011 | Maruno | B29C 65/5057 428/215 |
| 2012/0068355 A1 | 3/2012 | Aoki et al. | |
| 2012/0306095 A1* | 12/2012 | Han | H01L 25/0657 257/774 |
| 2013/0009321 A1 | 1/2013 | Kagawa et al. | |
| 2013/0084459 A1* | 4/2013 | Larson | C09J 4/00 428/422 |
| 2013/0087919 A1* | 4/2013 | Chung | H01L 25/0657 257/771 |
| 2013/0140699 A1 | 6/2013 | Okuyama | |
| 2013/0207271 A1 | 8/2013 | Hagimoto et al. | |
| 2014/0170849 A1* | 6/2014 | Shu | B81C 1/00238 438/612 |
| 2014/0239499 A1 | 8/2014 | Okuyama | |
| 2014/0284744 A1 | 9/2014 | Fujii et al. | |
| 2014/0362267 A1 | 12/2014 | Kagawa et al. | |
| 2015/0270212 A1 | 9/2015 | Kagawa et al. | |
| 2016/0035777 A1 | 2/2016 | Fujii et al. | |
| 2016/0126279 A1 | 5/2016 | Okuyama | |
| 2016/0141267 A1 | 5/2016 | Hagimoto et al. | |
| 2016/0190101 A1* | 6/2016 | Yu | H01L 23/3128 257/774 |

FOREIGN PATENT DOCUMENTS

| | | |
|---|---|---|
| JP | 2012-69585 | 4/2012 |
| JP | 2013-33900 | 2/2013 |
| JP | 2013-168419 | 8/2013 |
| JP | 5407660 | 2/2014 |
| TW | 201133734 A1 | 10/2011 |
| TW | 201438208 A | 10/2014 |

OTHER PUBLICATIONS

Korean Office Action issued in Korean Patent Application No. 10-2015-0147331 on Aug. 12, 2016. With English translation (8 pages).

* cited by examiner

SEMICONDUCTOR DEVICE HAVING A LOW-ADHESIVE BOND SUBSTRATE PAIR

CROSS-REFERENCE TO RELATED APPLICATIONS

This application is based upon and claims the benefit of priority from Japanese Patent Application No. 2014-224602, filed on Nov. 4, 2014; the entire contents of which are incorporated herein by reference.

FIELD

Embodiments described herein relate generally to a semiconductor device and a method for manufacturing a semiconductor device

BACKGROUND

There have been semiconductor devices with semiconductor chips stacked in multiple stages, thus allowing a reduction in footprint. Such semiconductor devices are manufactured by bonding, in multiple stages, substrates in which semiconductor elements or integrated circuits are formed, and dicing them into semiconductor chips, for example.

A semiconductor oxide film is generally provided on a surface of each substrate to be bonded, and a plurality of electrodes to be connected by bonding substrates is provided in corresponding positions in a surface of each semiconductor oxide film. Here, in a step of bonding substrates to each other, misalignment in position of electrodes to be connected may be produced.

In such a case, metal of an electrode provided in one substrate directly contacts a semiconductor oxide film provided on a surface of another substrate, and is diffused into the other substrate in a heat treatment step performed later, adversely affecting the characteristics of a semiconductor element or an integrated circuit provided in the other substrate.

BRIEF DESCRIPTION OF THE DRAWINGS

FIGS. 2A to 4C are explanatory diagrams illustrating a process of manufacturing the semiconductor device according to the embodiment;

DETAILED DESCRIPTION

According to the embodiment, a semiconductor device is provided. The semiconductor device includes a low-adhesion film, a pair of substrates, and a metal electrode. The low-adhesion film has lower adhesion to metal than a semiconductor oxide film. The pair of substrates is provided with the low-adhesion film interposed therebetween. The metal electrode passes through the low-adhesion film and connects the pair of substrates, and includes, between the pair of substrates, a part thinner than parts embedded in the pair of substrates. A portion of the metal electrode embedded in one of the substrates is provided with a gap interposed between the portion and the low-adhesion film on the other substrate.

Hereinafter with reference to the accompanying drawings, a semiconductor device and a method for manufacturing the semiconductor device according to an embodiment will be described in detail. This embodiment is not intended to limit the present invention. Hereinafter, so-called Wafer on Wafer in which a first substrate in which a logic circuit is formed and a second substrate in which an image sensor is formed are bonded together will be described as an example, but the method for manufacturing the semiconductor device according to this embodiment can also be used for Chip on Wafer or Chip on Chip. Circuits formed in the first substrate and the second substrate are not limited to the logic circuit and the image sensor, and may be any semiconductor integrated circuits.

Figure 1:
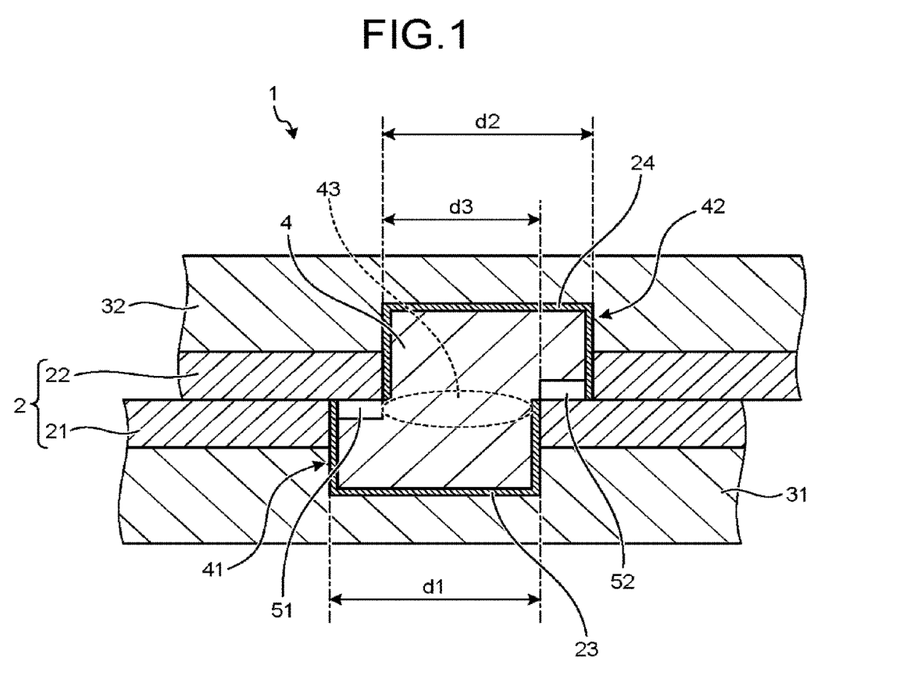
FIG. 1 is an explanatory diagram illustrating a schematic section of a semiconductor device according to an embodiment.

FIG. 1 is an explanatory diagram illustrating a schematic section of a semiconductor device 1 according to an embodiment. As illustrated in FIG. 1, the semiconductor device 1 includes a low-adhesion film 2, a first substrate 31 and a second substrate 32, and a metal electrode 4 (hereinafter, simply written as an "electrode 4").

The low-adhesion film 2 a film formed by a material that has lower adhesion to metal than a semiconductor oxide film (e.g. a silicon oxide film to which no impurities are added). Here the material that has lower adhesion to metal than a semiconductor oxide film is formed, for example, by a silicon nitride, a silicon nitride to which carbon is added, an insulating film such as a silicon oxide to which carbon is added, a low-k material, or the like.

The low-adhesion film 2 is formed by bonding together a first low-adhesion film 21 provided on a surface of the first substrate 31 before bonding and a second low-adhesion film 22 provided on a surface of the second substrate 32 before bonding.

The first substrate 31 and the second substrate 32 are semiconductor substrates such as silicon wafers, for example. A logic circuit (not illustrated) is built in the first substrate 31. An image sensor (not illustrated) is built in the second substrate 32. The first substrate 31 and the second substrate 32 are provided with the low-adhesion film 2 interposed therebetween.

The electrode 4 is formed by copper, for example, and passes through the low-adhesion film 2 and connects the logic circuit built in the first substrate 31 and the image sensor built in the second substrate 32. Material of the electrode 4 may be a metal other than copper.

The electrode 4 includes a part embedded in the first substrate 31 (hereinafter, written as a "first part 41") and a part embedded in the second substrate 32 (hereinafter, written as a "second part 42"). Further, the electrode 4 includes a part connecting the first part 41 and the second part 42 (hereinafter, written as a "third part 43"). The width d3 of the third part 43 is narrower than the width d1 of the first part 41 and the width d2 of the second part 42.

The semiconductor device 1 also includes barrier metal 23 formed by tantalum or a tantalum nitride between the first part 41 of the electrode 4 and the first substrate 31 and the first low-adhesion film 21. The semiconductor device 1 also includes barrier metal 24 formed by tantalum or a tantalum nitride, for example, between the second part 42 of the electrode 4 and the second substrate 32 and the second low-adhesion film 22.

The first part 41, a portion of the electrode 4 embedded in the first substrate 31, one substrate, is provided with a gap 51 interposed between the first part 41 and the second low-adhesion film 22 on the second substrate 32, the other substrate. The second part 42, a portion of the electrode 4 embedded in the second substrate 32, the other substrate, is provided with a gap 52 interposed between the second part 42 and the first low-adhesion film 21 on the first substrate 31, the one substrate.

Therefore, in the semiconductor device 1, a part of a peripheral surface of the first part 41 facing the second substrate 32 does not contact the second low-adhesion film 22. Thus the metal of the first part 41 can be prevented from being diffused into the second substrate 32 via the second low-adhesion film 22.

Likewise, in the semiconductor device 1, a part of a peripheral surface of the second part 42 facing the first substrate 31 does not contact the first low-adhesion film 21. Thus the metal of the second part 42 can be prevented from being diffused into the first substrate 31 via the first low-adhesion film 21.

The semiconductor device 1 can prevent diffusion of the metal from the first part 41 of the electrode 4 into the first substrate 31 by the barrier metal 23, and can prevent diffusion of the metal from the second part 42 of the electrode 4 into the second substrate 32 by the barrier metal 24.

Figure 2A:
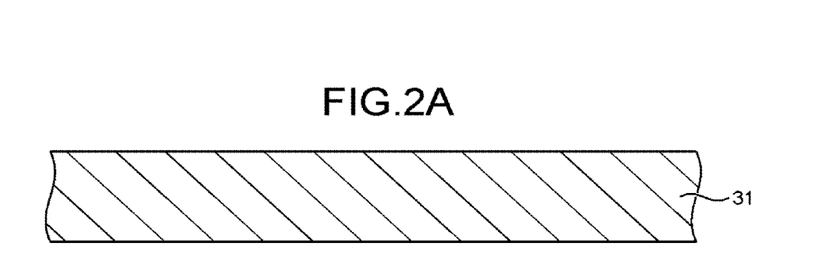

Next, with reference to FIGS. 2A to 4C, a method for manufacturing the semiconductor device 1 will be described. FIGS. 2A to 4C are explanatory diagrams illustrating a process of manufacturing the semiconductor device 1 according to the embodiment. When the semiconductor device 1 is manufactured, first, as illustrated in FIG. 2A, the first substrate 31 in which the logic circuit (not illustrated) is built is prepared.

Figure 2B:
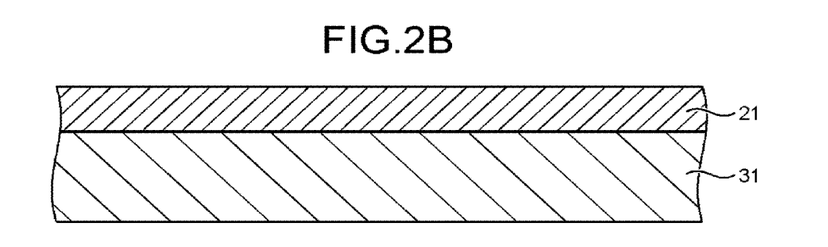

Then, as illustrated in FIG. 2B, on a surface of the first substrate 31, the first low-adhesion film 21 is formed, for example, by a silicon nitride, a silicon nitride to which carbon is added, an insulating film such as a silicon oxide to which carbon is added, a low-k material, or the like.

With this, the first low-adhesion film 21 with low adhesive to copper, the material of the electrode 4 to be formed later, can be formed. The first low-adhesion film 21 is formed by chemical vapor deposition (CVD), for example. When the first low-adhesion film 21 is formed by an organic low-k material, the first low-adhesion film 21 may be formed by a spin coater.

Here, the first low-adhesion film 21 is formed on the surface of the first substrate 31. Alternatively, the first low-adhesion film 21 may be formed on a surface of a silicon oxide film after the silicon oxide film is formed on the surface of the first substrate 31 as an interlayer dielectric.

Figure 2C:
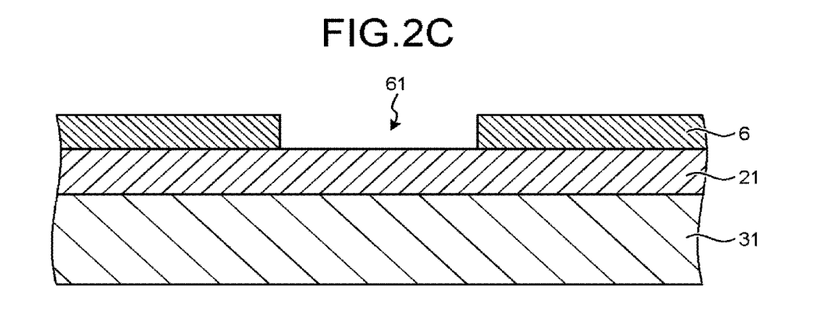

Subsequently, as illustrated in FIG. 2C, after a resist 6 is applied to a surface of the first low-adhesion film 21, the resist 6 on a position in which to form the electrode 4 is removed by photolithography to form an opening 61.

Figure 2D:
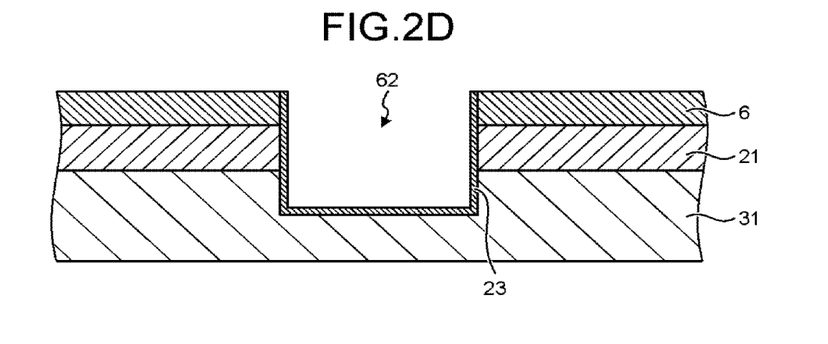

Then, as illustrated in FIG. 2D, using the resist 6 as a mask, anisotropic etching such as reactive ion etching (RIE), for example, is performed on the first low-adhesion film 21 and the first substrate 31, thereby forming an opening 62 in the first substrate 31. Here, etching is performed until a bottom surface of the opening 62 is at a depth to reach wiring of the logic circuit. Thereafter, on an inner peripheral surface of the opening 62, the barrier metal 23 is formed by tantalum or a tantalum nitride, for example.

Figure 3A:
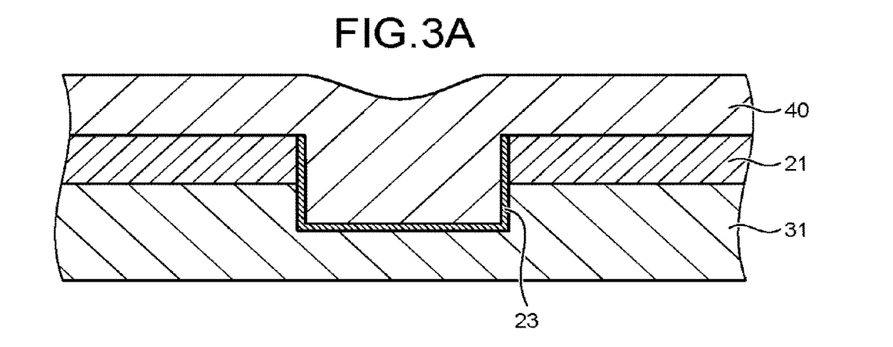

Subsequently, as illustrated in FIG. 3A, after the resist 6 is removed, a copper layer 40 is placed on the opening 62 and the first low-adhesion film 21 by electrolytic plating or CVD, for example, to fill the opening 62 with copper.

Figure 3B:
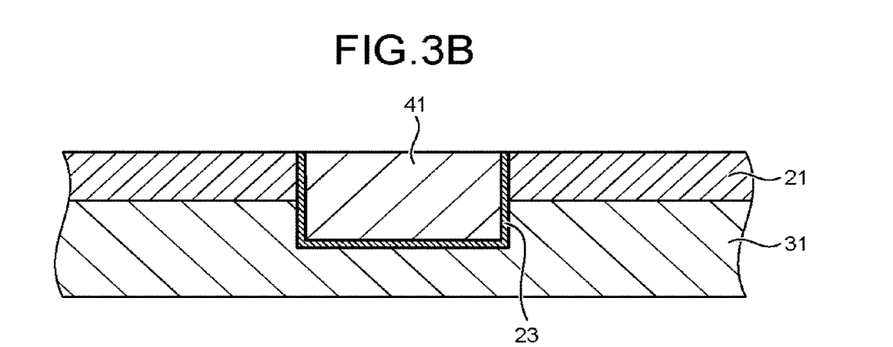
Figure 3C:
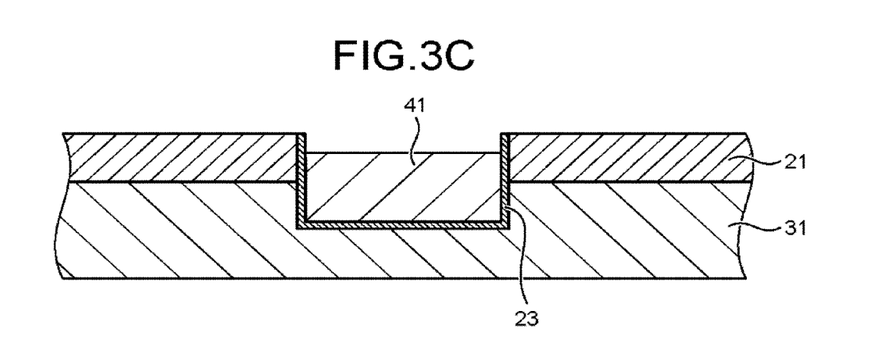

Then, the copper layer 40 is polished by chemical mechanical polishing (CMP), for example, to form the first part 41 of the electrode 4 as illustrated in FIG. 3B. Thereafter, polishing by CMP is continued further to retreat a surface of the first part 41 in the electrode 4 several nm (e.g. 3 to 9 nm) from a surface of the first low-adhesion film 21 as illustrated in FIG. 3C.

On the second substrate 32 to be bonded to the first substrate 31, by a process similar to the above-described process, the second low-adhesion film 22 is formed on the surface and the second part 42 of the electrode 4 is formed. Then, a surface of the second part 42 of the electrode 4 is retreated several nm from a surface of the second low-adhesion film 22. The second part 42 of the electrode 4 formed in the second substrate 32 is formed by the process similar to that of the first part 41, and thus has a thickness equal to that of the first part 41.

Thereafter, the surface of the first low-adhesion film 21 and the surface of the second low-adhesion film 22 are plasma-treated to activate the surface of the first low-adhesion film 21 and the surface of the second low-adhesion film 22 to form a dangling bond on the surface of the first low-adhesion film 21 and the surface of the second low-adhesion film 22. Further, the surface of the first low-adhesion film 21 and the surface of the second low-adhesion film 22 are cleaned by pure water to cause hydroxyl groups to adhere to the dangling bond.

Figure 4A:
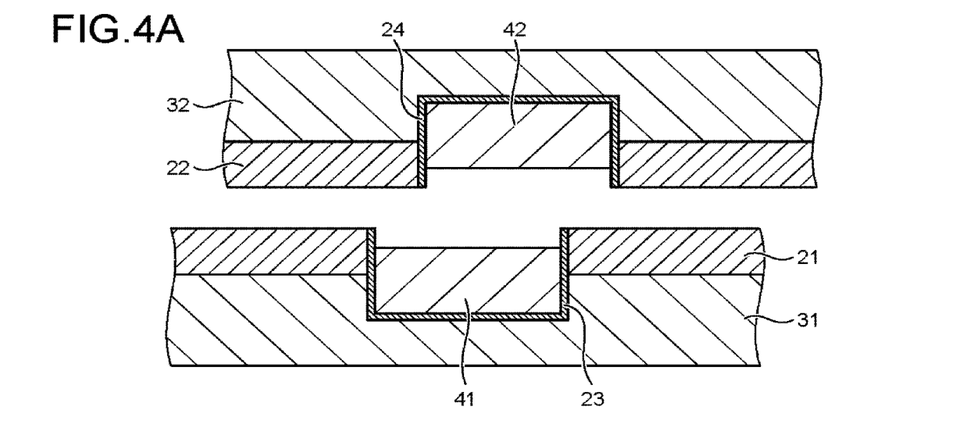

Then, as illustrated in FIG. 4A, the first substrate 31 and the second substrate 32 are disposed to correspond to each other so that the first low-adhesion film 21 on the surface of the first substrate 31 and the second low-adhesion film 22 on the surface of the second substrate 32 face each other. Thereafter, as illustrated in FIG. 4B, the surface of the first low-adhesion film 21 and the surface of the second low-adhesion film 22 are joined to bond the first substrate 31 and the second substrate 32 together.

Figure 4B:
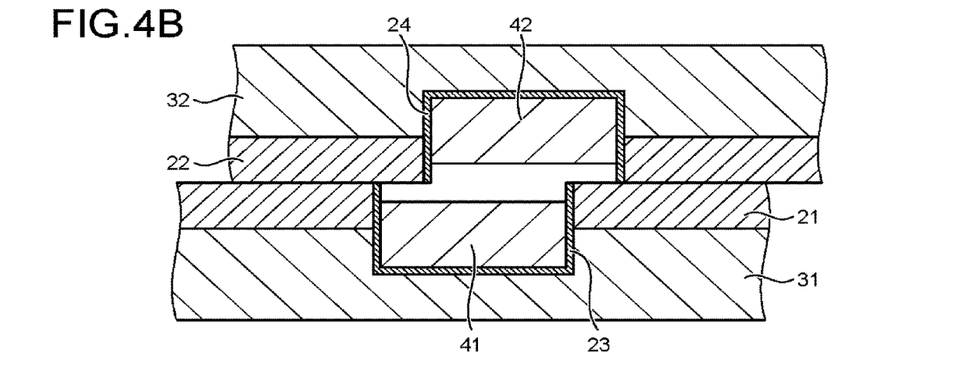

At this time, when the precision of alignment between the first substrate 31 and the second substrate 32 is inadequate, or when there is a difference in formation positions between the first part 41 and the second part 42 of the electrode 4, as illustrated in FIG. 4B, misalignment is produced between the position of the first part 41 and the position of the second part 42.

In such a case, in this embodiment, since the first part 41 of the electrode 4 is retreated several nm from the surface of the first low-adhesion film 21, the first part 41 does not contact the surface of the second low-adhesion film 22, and thus diffusion of the copper of the first part 41 into the second substrate 32 can be prevented.

Likewise, in this embodiment, since the second part 42 of the electrode 4 is retreated several nm from the surface of the second low-adhesion film 22, the second part 42 does not contact the surface of the first low-adhesion film 21, and thus diffusion of the copper of the second part 42 into the first substrate 31 can be prevented.

In this stage, the first part 41 and the second part 42 of the electrode 4 are not connected, and joining forces between the first low-adhesion film 21 and the second low-adhesion film 22 are insufficient. Specifically, when only joined, the first low-adhesion film 21 and the second low-adhesion film 22 are in a state of being joined by intermolecular forces of hydrogen bonds between hydroxyl groups in the bonded surfaces, relatively weak joining forces.

Figure 4C:
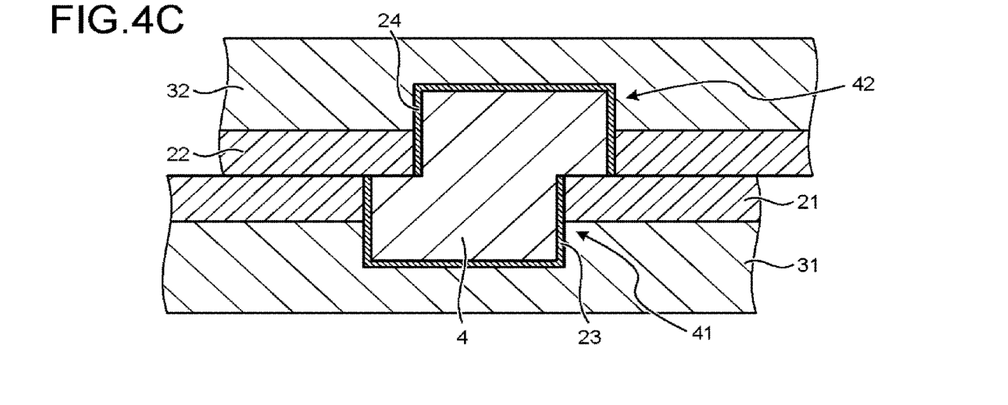

Therefore, heat treatment is performed to connect the first part 41 and the second part 42 of the electrode 4 and increase the joining forces between the first low-adhesion film 21 and the second low-adhesion film 22. With this, as illustrated in FIG. 4C, the first part 41 and the second part 42 of the electrode 4 are thermally expanded and connected. At the same time, water molecules are evaporated from a joint surface between the first low-adhesion film 21 and the second low-adhesion film 22, and the first low-adhesion film 21 and the second low-adhesion film are joined by strong joining forces due to covalent bonds.

The thermal expansion at this time may cause temporary contact between the first part 41 and the second low-adhesion film 22 and contact between the second part 42 and the first low-adhesion film 21. However, after that, when the heat treatment is completed and the electrode 4 returns to room temperature, the electrode 4 thermally contracts.

Here, as described above, the first low-adhesion film 21 and the second low-adhesion film 22 are formed by a silicon nitride, a silicon nitride to which carbon is added, an insulating film such as a silicon oxide to which carbon is added, a low-k material, or the like.

Therefore, when the electrode 4 thermally contracts, a gap 51 is formed between a part of a peripheral surface of the first part 41 facing the second substrate 32 and the second low-adhesion film 22, and a gap 52 is formed between a part of a peripheral surface of the second part 42 facing the first substrate 31 and the first low-adhesion film 21. Further, a third part 43 is formed by a connecting portion between the first part 41 and the second part 42 narrowing by thermal contraction, completing the semiconductor device 1 illustrated in FIG. 1.

Here, as described above, before the first substrate 31 and the second substrate 32 are bonded together, the thickness of the first part 41 and the thickness of the second part 42 are equal. Thus, the gaps 51 and 52 of the same size are formed on the opposite sides of the third part 43 in the electrode 4 (see FIG. 1).

With this, the first part 41, a portion of the electrode 4 embedded in the first substrate 31, one substrate, is provided with the gap 51 of substantially the same size as the gap 52 between the second part 42, a portion of the electrode 4 embedded in the second substrate 32, the other substrate, and the first low-adhesion film 21 on the first substrate 31, the one substrate, interposed between the first part 41 and the second low-adhesion film 22 on the second substrate 32, the other substrate. Therefore, joint strength across the joint surface between the first low-adhesion film 21 and the second low-adhesion film 22 can be made uniform.

When the first part 41 contacts the second low-adhesion film 22 and the second part 42 contacts the first low-adhesion film 21 temporarily during the heat treatment, by retreating the surfaces of the first part 41 and the second part 42 of the electrode 4 several nm further, occurrence of such temporary contacts can be prevented.

As described above, a semiconductor device according to the embodiment includes a pair of substrates provided with a low-adhesion film that has lower adhesion to metal than a semiconductor oxide film interposed therebetween, and a metal electrode passing through the low-adhesion film and connecting the pair of substrates. The metal electrode includes, between the pair of substrates, a part thinner than parts embedded in the pair of substrates.

Further, a portion of the metal electrode embedded in one substrate according to the embodiment is provided with a gap interposed between the portion and the low-adhesion film on the other substrate. The gap allows the semiconductor device to prevent diffusion of metal of the metal electrode provided in the surface of one substrate into the other substrate.

The above-described embodiment has provided an example in which a low-adhesion film is provided on both a first substrate and a second substrate, both a first part and a second part in an electrode are retreated from surfaces of the low-adhesion films, and the first substrate and the second substrate are bonded together, which is an example.

Specifically, a low-adhesion film may be provided on one of the first substrate and the second substrate. Further, one of the first part and the second part in the electrode may be retreated from a surface of a low-adhesion film to bond the first substrate and the second substrate together. Hereinafter, modifications with such configurations will be described with reference to FIGS. 5A to 6B.

Figure 5A:
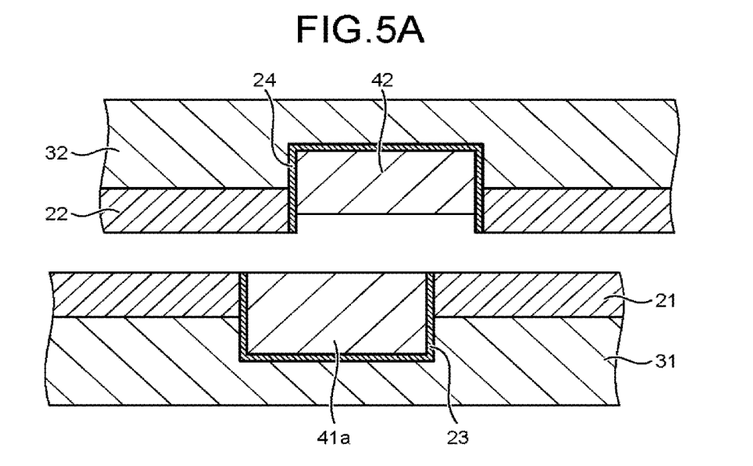
FIGS. 5A and 5B are explanatory diagrams illustrating a schematic section of a semiconductor device according to a first modification of the embodiment.
Figure 5B:
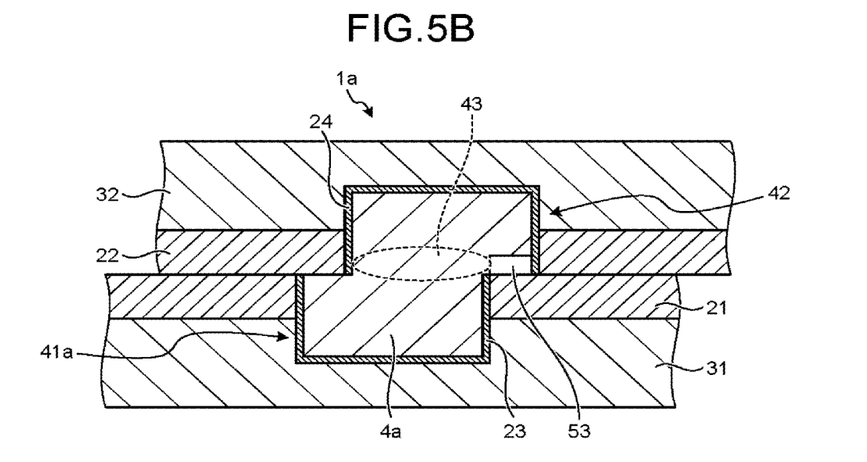
Figure 6A:
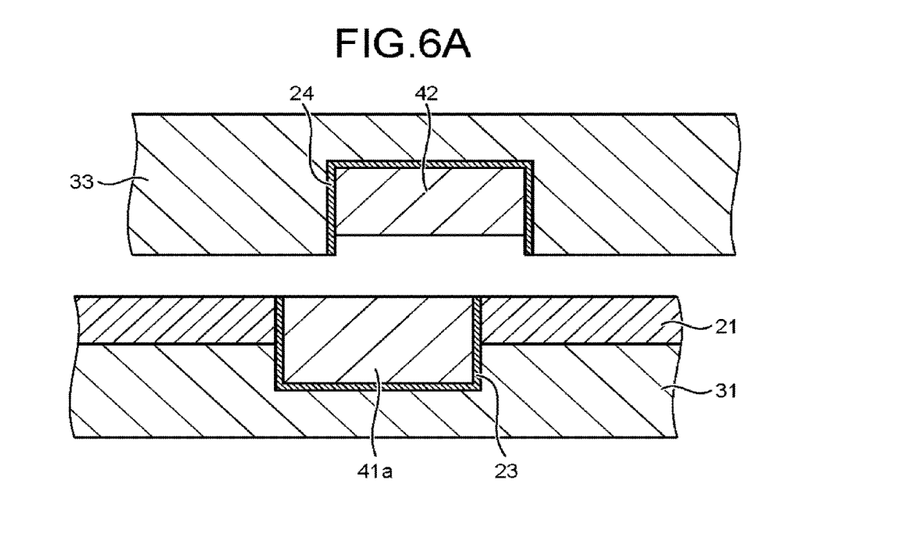
FIGS. 6A and 6B are explanatory diagrams illustrating a schematic section of a semiconductor device according to a second modification of the embodiment.
Figure 6B:
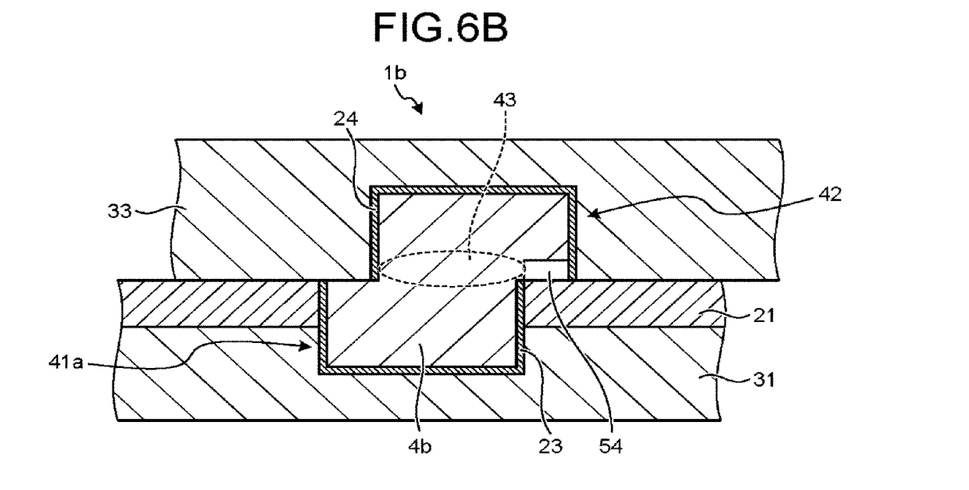

FIGS. 5A and 5B are explanatory diagrams illustrating a schematic section of a semiconductor device 1a according to a first modification of the embodiment. FIGS. 6A and 6B are explanatory diagrams illustrating a schematic section of a semiconductor device 1b according to a second modification of the embodiment. Of components illustrated in FIGS. 5A to 6B, components identical to the components illustrated in FIG. 1 are denoted by reference numerals identical to the reference numerals illustrated in FIG. 1, and will not be described.

In the first modification, as illustrated in FIG. 5A, a first substrate 31 on which a first low-adhesion film 21 is formed and a surface of a first part 41a of an electrode is made flush with a surface of the first low-adhesion film 21, and a second substrate 32 on which a second low-adhesion film 22 is formed and a surface of a second part 42 of the electrode is retreated from a surface of the second low-adhesion film 22, are used.

When the first substrate 31 and the second substrate 32 are bonded together and heat-treated, as illustrated in FIG. 5B, the first part 41a and the second part 42 are thermally expanded and connected to be an electrode 4a. Thereafter, when the heat treatment is completed and the electrode 4a returns to room temperature, in the semiconductor device 1a, a gap 53 is formed between a part of a peripheral surface of the second part 42 in the electrode 4a facing the first substrate 31 and the first low-adhesion film 21.

With this, in the semiconductor device 1a, the part of the peripheral surface of the second part 42 facing the first substrate 31 does not contact the first low-adhesion film 21, and thus metal of the second part 42 can be prevented from being diffused into the first substrate 31 via the first low-adhesion film 21.

Therefore, when there is an element that is degraded in characteristics by diffusion of metal in the vicinity of the first part 41a, and there is no element that is degraded in characteristics by diffusion of metal in the vicinity of the second part 42, the semiconductor device is can prevent characteristic degradation of the element in the vicinity of the first part 41a.

Further, since there is no gap between a part of a peripheral surface of the first part 41a facing the second substrate 32 and the second low-adhesion film 22, the semiconductor device 1a can increase joint strength between the first low-adhesion film 21 and the second low-adhesion film 22.

In a second modification, as illustrated in FIG. 6A, a first substrate 31 on which a first low-adhesion film 21 is formed and a surface of a first part 41a of an electrode is made flush with a surface of the first low-adhesion film 21, and a second substrate 33 on which a second low-adhesion film 22 is not formed and a surface of a second part 42 of the electrode is retreated from a joint surface, are used.

When the first substrate 31 and the second substrate 33 are bonded together and heat-treated, as illustrated in FIG. 6B, the first part 41a and the second part 42 are thermally expanded and connected to be an electrode 4b. Thereafter, when the heat treatment is completed and the electrode 4b returns to room temperature, in the semiconductor device 1b, a gap 54 is formed between a part of a peripheral surface of the second part 42 in the electrode 4b facing the first substrate 31 and the first low-adhesion film 21.

With this, in the semiconductor device 1b, the part of the peripheral surface of the second part 42 facing the first substrate 31 does not contact the first low-adhesion film 21, and thus metal of the second part 42 can be prevented from being diffused into the first substrate 31 via the first low-adhesion film 21.

Therefore, when there is an element that is degraded in characteristics by diffusion of metal in the vicinity of the first part 41a, and there is no element that is degraded in characteristics by diffusion of metal in the vicinity of the second part 42, the semiconductor device 1b can prevent characteristic degradation of the element in the vicinity of the first part 41a.

Further, since there is no gap between a part of a peripheral surface of the first part 41a facing the second substrate 33 and the second substrate 33, the semiconductor device 1b can increase joint strength between the first low-adhesion film 21 and the second substrate 33. Further, when the semiconductor device 1b is manufactured, a step of forming a second low-adhesion film 22 on a surface of the second substrate 33 can be omitted, and thus the manufacturing process can be simplified.

The above-described embodiment has provided an example in which a pair of substrates is bonded together with a low-adhesion film interposed therebetween. The embodiment is also applicable to a semiconductor device manufactured by bonding three or more substrates together and a method for manufacturing the semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a low-adhesion film that has lower adhesion to metal than a semiconductor oxide film;
   a pair of substrates provided with the low-adhesion film interposed therebetween; and
   a metal electrode that passes through the low-adhesion film and connects the pair of substrates, the metal electrode including, between the pair of substrates, a part thinner than parts embedded in the pair of substrates,
   wherein a portion of the metal electrode embedded in one of the substrates is provided with a gap interposed between the portion and the low-adhesion film on another substrate.

2. The semiconductor device according to claim 1, wherein a portion of the metal electrode embedded in the other substrate is provided with a gap interposed between the portion and the low-adhesion film on the one substrate.

3. The semiconductor device according to claim 1, wherein the metal electrode has a thickness at a part embedded in the one substrate equal to a thickness at a part embedded in the other substrate.

4. The semiconductor device according to claim 1, wherein the low-adhesion film is a film formed by a semiconductor nitride film, a semiconductor oxide film containing carbon, or a low-k material.

5. The semiconductor device according to claim 1, wherein the low-adhesion film is a film that has lower adhesion to metal than a silicon oxide to which no impurities are added.

6. The semiconductor device according to claim 1, wherein the low-adhesion film includes:
   a first low-adhesion film that has lower adhesion to metal than a semiconductor oxide film, the first low-adhesion film being provided on a surface of a first substrate of the pair of substrates; and
   a second low-adhesion film that has lower adhesion to metal than a semiconductor oxide film, the second low-adhesion film being provided on a surface of a second substrate of the pair of substrates.

7. The semiconductor device according to claim 2, wherein the portion of the metal electrode embedded in the one substrate is provided with a gap interposed between the portion and the low-adhesion film on the other substrate, the gap being of substantially the same size as a gap between the portion of the metal electrode embedded in the other substrate and the low-adhesion film on the one substrate.

8. The semiconductor device according to claim 1, further comprising barrier metal provided between the pair of substrates and the metal electrode, and between the low-adhesion film and the metal electrode.

9. The semiconductor device according to claim 1, wherein the low-adhesion film is provided on a surface of the one of the pair of substrates.

10. The semiconductor device according to claim 1, wherein the one of the pair of substrates is a substrate in which a logic circuit is provided, and the other of the pair of substrates is a substrate in which an image sensor is provided.

* * * * *